United States Patent [19]
Carlson

[11] 4,200,473
[45] Apr. 29, 1980

[54] AMORPHOUS SILICON SCHOTTKY BARRIER SOLAR CELLS INCORPORATING A THIN INSULATING LAYER AND A THIN DOPED LAYER

[75] Inventor: David E. Carlson, Yardley, Pa.

[73] Assignee: RCA Corporation, New York, N.Y.

[21] Appl. No.: 19,585

[22] Filed: Mar. 12, 1979

[51] Int. Cl.² ............................................ H01L 31/06
[52] U.S. Cl. ................................ 136/89 SJ; 29/572;
136/89 TF; 357/2; 357/15; 357/30; 427/39;
427/74
[58] Field of Search .................... 136/89 TF, 89 SJ;
357/2, 15, 30; 427/74, 39; 29/572

[56] References Cited

U.S. PATENT DOCUMENTS

| | | | |
|---|---|---|---|
| 4,064,521 | 12/1977 | Carlson | 357/2 |
| 4,117,506 | 9/1978 | Carlson et al. | 357/30 |
| 4,142,195 | 2/1979 | Carlson et al. | 357/15 |

OTHER PUBLICATIONS

D. R. Lamb, "Some Electrical Properties of the Silicon-Silicon Dioxide System," *Thin Solid Films*, vol. 5, pp. 247–276 (1970).

D. E. Carlson, "The Effects of Impurities & Temperature on Amorphous Silicon Solar Cells," *1977 International Electronics & Devices Meeting*, Wash., D.C., pp. 214–217.

A. G. Revesz et al. "Reduction of Radiation Sensitivity in MOS Structures by Aluminum Doping of Silicon Dioxide," *J. Electrochem. Soc.*, vol. 116, pp. 1146–1148 (1969).

J. I. Pankove et al, "Photoluminescence of Hydrogenated Amorphous Silicon," *Appl. Phys. Lett.*, vol. 31, pp. 450–451 (1977).

A. Barna et al. "A Comparative Study of the Structure of Evaporated & Glow Discharge Silicon," *Phys. Stat. Sol.* (a), vol. 41, pp. 81–84 (1977).

*Primary Examiner*—Aaron Weisstuch
*Attorney, Agent, or Firm*—Birgit E. Morris; A. Stephen Zavell

[57] ABSTRACT

Amorphous silicon Schottky barrier solar cells which incorporate a thin insulating layer and a thin doped layer adjacent to the junction forming metal layer exhibit increased open circuit voltages compared to standard rectifying junction metal devices, i.e., Schottky barrier devices, and rectifying junction metal insulating silicon devices, i.e., MIS devices.

12 Claims, 1 Drawing Figure

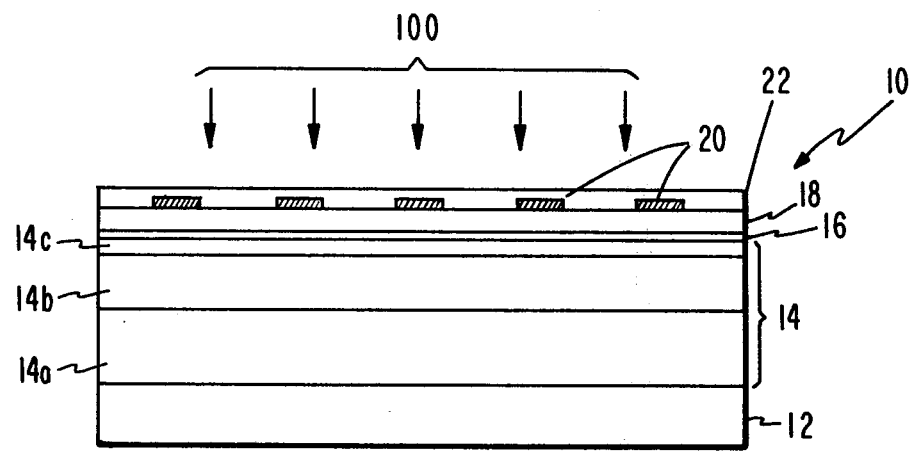

AMORPHOUS SILICON SCHOTTKY BARRIER SOLAR CELLS INCORPORATING A THIN INSULATING LAYER AND A THIN DOPED LAYER

The invention described herein was made during the performance of work under an Energy Research and Development Administration, now the Department of Energy, Contract #EY-76-C-03-1286.

The present invention relates to amorphous silicon solar cells. More particularly, the invention relates to rectifying metal junction amorphous silicon structures such as Schottky devices.

BACKGROUND OF THE INVENTION

Photovoltaic devices, such as amorphous silicon solar cells, are capable of converting solar radiation into useable electrical energy. The energy conversion occurs as a result of what is well known in the solar cell field as the photovoltaic effect. Solar radiation impinging on a solar cell and absorbed by the amorphous silicon generates electrons and holes. The electrons and holes are separated by a built-in electric field, for example, by a rectifying junction such as a Schottky barrier, in the solar cell. The electrons generated at the junction of a metal (Schottky barrier) and an N-type semiconductor body flow toward the semiconductor body where said electrons are collected. The separation of electrons and holes results in the generation of an electrical current.

Amorphous silicon Schottky barrier solar cells tend to generate higher currents but lower voltages than PIN amorphous silicon solar cells. Application Ser. No. 901,256, filed Apr. 28, 1978, and incorporated herein by reference, discloses a Schottky barrier amorphous silicon solar cell incorporating a thin highly doped P+ layer contiguous to the high work function Schottky barrier metal. Application Ser. No. 819,936, filed July 28, 1977, now U.S. Pat. No. 4,117,506, and incorporated herein by reference, discloses an amorphous silicon solar cell incorporating a thin insulating region between the body of amorphous silicon and the high work function Schottky barrier metal. Solar cells incorporating either the thin highly doped P+ layer or the thin insulating region exhibit higher open circuit voltages than conventional high work function metal-amorphous silicon Schottky barrier solar cells. Since the magnitude of the open circuit voltage of the solar cell is dependent, inter alia, upon the height of the barrier between the body of amorphous silicon and the Schottky barrier metal, it would be desirable to increase the barrier height and increase the open circuit voltage without decreasing other parameters of the solar cell such as the short circuit current.

SUMMARY OF THE INVENTION

The present amorphous silicon solar cell includes a thin, highly doped P+ type region in the body of amorphous silicon, a thin insulating layer contacting said P+ type region and a Schottky barrier metal layer. The thin highly doped P+ type region and the thin insulating layer increase the barrier junction height and the open circuit voltage of the solar cell over conventional amorphous silicon MIS solar cells and amorphous silicon Schottky barrier or Schottky barrier solar cells incorporating a thin highly doped P+ type region adjacent to the Schottky barrier metal.

BRIEF DESCRIPTION OF THE DRAWING

The FIGURE illustrates an amorphous silicon solar cell incorporating a thin insulating layer and a thin highly doped P+ type region between the Schottky barrier metal and the intrinsic and N+ type regions of the body of hydrogenated amorphous silicon.

DETAILED DESCRIPTION OF THE INVENTION

Referring to the FIGURE, a Schottky barrier hydrogenated amorphous silicon solar cell of the present invention is designated as 10, hereinafter solar cell 10. Solar radiation 100 impinging upon solar cell 10 is a reference point for the incident surface of each layer or region of the solar cell. Solar cell 10 includes a substrate 12 of material having good electrical conductivity properties and the ability to make an ohmic contact to the body 14 of hydrogenated amorphous silicon. Examples of suitable substrate materials are aluminum, chromium, stainless steel, niobium, tantalum, iron, molybdenum, titanium, indium tin oxide on glass wherein the indium tin oxide is the conductive material, and the like.

The body 14 body 14 of hydrogenated amorphous silicon is fabricated by a glow discharge as taught in U.S. Pat. No. 4,064,521, incorporated herein by reference or "An Article And A Device Having An Amorphous silicon Containing A Halogen and A Method Of Fabrication", Ser. No. 727,659, filed Sept. 29, 1976, incorporated herein by reference or "A Schottky Barrier Semiconductor Device And Method Of Making Same", Ser. No. 710,186, filed July 30, 1976, now U.S. Pat. No. 4,142,195, and incorporated herein by reference. The method of deposition known as flow discharge involves the discharge of electricity through a gas at a relatively low pressure, i.e., about 5 Torr or less. The discharge power source can either be RF power, AC power, DC cathodic discharge, or DC proximity discharge. A DC proximity discharge is defined to mean a DC discharge where the substrate is located near or in the proximity of a cathode screen electrode. In a DC proximity discharge, the negative terminal of the power source is connected to a screen cathode and the positive terminal of the power source is connected to a separate electrode which functions as the anode. Suitable conditions for DC proximity discharge are temperatures from about 250° C. to about 350° C., pressures from about 0.20 Torr to about 0.75 Torr, and a current density of from about 0.20 to about 0.50 mA/cm$^2$.

The hydrogenated amorphous silicon material is one which has no long range order of periodicity of the matrix. As indicated by A. Barna et al, Phys. Stat. Sol. A41, 81 (1977), the short range order of periodicity is less than 1 nanometer, i.e. 10 angstroms. The performance of the material is related to the concentration of hydrogen contained therein, as taught by Pankove and Carlson in Appl. Phys. Lett. 31, 450 (1977). If the amorphous silicon is deposited at too high a temperature, i.e., greater than about 400° C., or annealed after deposition at too high a temperature, i.e., greater than about 400° C., then the performance of the device is degraded, probably due to the outdiffusion of hydrogen from the film.

The body of hydrogenated amorphous silicon is composed of three regions, 14a, 14b, and 14c, of different conductivity. Region 14a, contiguous to and deposited on substrate 12, is doped N+ type with suitable conductivity modifiers such as phosphorous and arsenic or materials such as antimony, bismuth, cesium, sodium and the like. The N+ type region 14a assures an ohmic contact to the conducting substrate 12. The region 14a may have a thickness of up to about 1000 nanometers if the substrate 12 has a rough surface, although, preferably, the thickness is on the order from about 10 to about 50 nanometers.

After the deposition of the N+ type region 14a, the doping gas is pumped out of the system and the deposition is contained in a silicon, hydrogen containing atmosphere to deposit a region 14b of intrinsic hydrogenated amorphous silicon. Intrinsic hydrogenated amorphous silicon, fabricated by a flow discharge without conductivity modifiers incorporated in the deposition system, is slightly N type. Region 14b has a thickness of from about 200 to 1000 nanometers and preferably about 400 nanometers. The thickness of region 14b should be adjusted so that it is approximately equal to the width of the space charge region generated by the solar cell during illumination at zero bias plus the hole diffusion length of the device.

The body 14 is completed by the deposition of a P+ type region 14c having a thickness of up to about 20 nanometers and preferably from about 5 to about 10 nanometers. Suitable P type conductivity modifiers include boron, aluminum and the like. The concentration of the P type conductivity modifier in the glow discharge apparatus is from about 0.001 to about 1.0% of the silane or halogen containing silicon compound atmosphere. Preferably, the P type conductivity modifier concentration is about 0.10% by volume of the glow discharge atmosphere. Said P type dopant concentration will result in a P type region with a doping concentration of from about $5\times10^{18}$ to about $5\times10^{20}$ P type dopant atoms per cubic centimeter. The doping concentration and the thickness of the P+ type region is adjusted so that the Schottky barrier metal fully ionizes said P+ type region 14c.

A thin insulating layer 16 with a thickness of from about 1 to about 5 nanometers is formed on said P+ type region 14c prior to the deposition of the Schottky barrier metal layer 18. The thin insulating layer 16 may be deposited by evaporation, sputtering or glow discharge deposition of silicon nitride, $Si_3N_4$, $SiO_2$ and the like or by thermal oxidation of the substrate 12 containing region 14 in air at a temperature of from about 300° C. to about 350° C. for from about 10 minutes to about 30 minutes. The thin insulating layer, when contacting thin highly doped P+ type region, should be constructed so as to impede the flow of electrons in said layer. This can be achieved by imparting a negative charge to the insulating layer by doping said layer during the growth or deposition process.

If the solar cell 10 is a Schottky barrier device with a low work function metal contacting an N+ type layer, then the insulating layer must impede the flow of holes towards said Schottky barrier. This can be accomplished by having a slight plus charge in the insulating layer or a band structure in said layer that inhibits the hole transport while enhancing, or not impeding, the tunneling of electrons through said layer.

A Schottky barrier metal layer 18 which is at least semitransparent to solar radiation and is of a metallic material with good electrical conductivity is deposited on insulating layer 16 by evaporation or other suitable means to a thickness of about 5 nanometers. If region 14c is of a P+ type conductivity, then the Schottky barrier metal layer 18 should be a high work function metal, i.e., 4.5 eV or greater, such as gold, palladium, platinum, iridium, rhodium, and the like.

After the deposition of the Schottky barrier, the solar cell is annealed in an atmosphere of hydrogen, nitrogen or mixtures thereof at a temperature of from about 150° C. to about 250° C. for from several minutes to an hour. Alternatively the solar cell can be annealed prior to the deposition of the Schottky barrier at temperatures up to about 400° C.

Ohmically contacting the Schottky barrier metal layer 18 is a metal grid electrode 20 of a material exhibiting good electrical conductivity. The grid 20 occupies only a small area of the surface of the metallic layer 18, i.e. about 5 to about 10%, since solar radiation impinging on a grid electrode 20 may be reflected away from the body 14. The function of the grid electrode is to uniformly collect current from the metallic layer 18. The grid electrode also assures a low series resistance from solar cell 10. As the size of the solar cell decreases, the need for the grid structure diminishes. With a small solar cell, a transparent conductive oxide layer 22, which may also double as the antireflection coating and having a sheet resistivity of less than about 10 ohms/sq., is sufficient to withdraw the current generated during the operation of solar cell 10. The transparent conductive oxide layer 22 functions as an antireflection coating and supplements the grid electrode 20. The transparent conductive oxide can be selected from the group consisting of tin oxide, indium tin oxide, cadmium stannate, and the like.

Although a high work function Schottky barrier silicon solar cell 10 has been described, an alternative structure would be a low work function Schottky barrier silicon solar cell wherein substrate 12 was selected from the group of materials which would form an ohmic contact to a P+ type region 14a. Region 14c would be doped N type and contact a low work function metal layer 18 such as lead, aluminum, barium, bismuth, molybdenum, and the like.

The invention will be further illustrated by the following examples, but it is to be understood that the invention is not meant to be limited solely to the details described therein. Modifications which would be obvious to one of ordinary skill in the solar cell art are contemplated to be within the scope of the invention

EXAMPLE I

A molybedenum substrate about 1 millimeter thick was sputter cleaned in a DC glow discharge at a pressure of about 0.6 Torr in an atmosphere containing 50% argon and about 50% hydrogen at a temperature of about 300° C. for about 4 minutes. An N+ type layer of hydrogenated amorphous silicon was deposited on the clean substrate in an atmosphere containing phosphine (PH$_3$) and silane in a ratio of about $2\times10^{-3}$:1 at a pressure of about 0.45 Torr and a temperature of about 340° C. The coating was deposited by a DC proximity discharge at a current density of about 0.25 milliamperes (mA) per square centimeter at the cathodic screen with a spacing of about 5 mm between the cathodic screen and the substrate. A layer thickness of about 60 nanometers was obtained in about 30 seconds.

The chamber was pumped out, pure silane bled in, and the deposition continued for about 7 minutes to deposit about a 1000 nanometer thick layer of intrinsic hydrogenated amorphous silicon. The current density during the deposition was about 0.5 mA/cm$^2$ at a temperature of about 310° C. and a pressure of about 0.7 Torr.

A P+ region was formed next by the addition of diborane ($B_2H_6$) to the silane atmosphere in an amount such that the diborane to silane ratio was $5\times10^{-4}:1$. During the deposition of the P+ region, the temperature was about 300° C. and the pressure of the system was about 0.32 Torr. The current density was about 0.1 mA/cm$^2$. About 10 seconds was required to deposit a P+ region about 20 nanometers thick.

Thereafter an insulating layer about 3 nanometers thick was formed on the region by heating the coated substrate in air for about 15 minutes at 350°.

A platinum contact about 5 nanometers thick was evaporated onto the insulating layer to form a Schottky barrier. An additional 40 nanometers of platinum followed by 1000 nanometers of aluminum were evaporated onto the 5 nanometers of platinum in a grid pattern to form a grid electrode.

Finally, the device was annealed in forming gas (80% nitrogen and 20% hydrogen) at 200° C. for about 15 minutes.

CONTROL EXAMPLES II–IV

Examples II–IV were made according to Example I. However, Example II was a standard platinum Schottky barrier amorphous silicon solar cell without an insulating layer or a P+ region. Example III was a Schottky barrier device (MIS) with a thermal oxide layer between the Schottky barrier metal (platinum) and the body of amorphous silicon. Example IV is a Schottky barrier amorphous silicon solar cell incorporating a thin P+ type region between the high work function metal (platinum) and the intrinsic hydrogenated amorphous silicon region.

Table I below gives a comparison of the open-circuit voltage ($V_{oc}$) and the short-circuit current density ($J_{sc}$) for the device of the present invention, Example I, and the devices of Examples II–IV.

TABLE I

| EXAMPLES | $V_{oc}$ (mV) | $J_{sc}$ (mA/cm$^2$) |
|---|---|---|
| I | 715–725 | 2.00–2.75 |
| II | 485–525 | 3.00–4.50 |
| III | 635–670 | 2.75–3.50 |
| IV | 630–670 | 2.00–2.75 |

The data indicates that the inclusion of a thermal oxide region between the platinum and the body of hydrogenated amorphous silicon or the inclusion of a thin highly doped P+ type region between the intrinsic hydrogenated amorphous silicon and the platinum layer raised the open circuit voltage of the solar cell above a conventional platinum Schottky barrier. Unexpectedly, the incorporation of both the thin highly doped P+ region and the thin thermal oxide layer increased the open-circuit voltage of the device more than either a device with a thin insulating layer or a device with a thin P+ region. Although the short-circuit currents are slightly lower than a conventional Schottky barrier device, it is believed that the thin insulating layer and the thin P+ type region were slightly thicker than optimum. Adjusting the thickness of said layers may increase the short-circuit current of the device of Example I to be equivalent to the short-circuit current of a conventional platinum Schottky barrier device similar to Example II.

I claim:

1. An amorphous silicon solar cell comprising:

an electrically conductive substrate;
a body of hydrogenated amorphous silicon including a first region of one conductivity type that electrically contacts said substrate, a second, intrinsic region contiguous to said first region and a third region of a conductivity type opposite to that of said first region and contiguous to said second region, wherein the thickness of said third region and the concentration of the conductivity modifiers in said third region are selected such that said third region is fully ionized by a Schottky barrier metal;
a layer of electrically insulating material contiguous to and deposited on said third region of hydrogenated amorphous silicon;
a metal layer contiguous to said insulating layer, forming a Schottky barrier therewith which is incident to solar radiation; and
means for electrically contacting said Schottky barrier.

2. The amorphous silicon solar cell according to claim 1 wherein said third region incorporates P type conductivity modifiers.

3. The amorphous silicon solar cell according to claim 2 wherein said third region is from about 5 to about 10 nanometers thick.

4. The amorphous silicon solar cell according to claim 3 wherein the P type conductivity modifier concentration is from about $5\times10^{18}$ to about $5\times10^{20}$ dopant atoms per cubic centimeter.

5. The amorphous silicon solar cell according to claim 2 wherein said Schottky barrier metal is selected from the group consisting of gold platinum, palladium, iridium, rhodium.

6. The amorphous silicon solar cell according to claim 1 wherein said third region incorporates N type conductivity modifiers.

7. The amorphous silicon solar cell according to claim 6 wherein said concentration of said N type conductivity modifiers is from about $5\times10^{18}$ to about $5\times10^{20}$ dopant atoms per cubic centimeter.

8. The amorphous silicon solar cell according to claim 6 wherein said metal which forms a Schottky barrier is selected from the group consisting of aluminum lead barium, bismuth and molybdenum.

9. The amorphous silicon solar cell according to claims 2 or 6 wherein said insulating layer is from about 1 to about 5 nanometers thick.

10. A method of forming an amorphous silicon solar cell comprising:

depositing on and ohmically contacting a substrate with a first region of hydrogenated amorphous silicon of one conductivity type;
depositing a second region of intrinsic hydrogenated amorphous silicon on said first region;
depositing a third region of hydrogenated amorphous silicon of conductivity type opposite to said first region on said second region of intrinsic hydrogenated amorphous silicon wherein the first, second and third regions are formed in a direct current proximity discharge at a current density of from about 0.20 to about 0.50 mA/cm$^2$, a temperature of from about 250° C. to about 350° C. and at a pressure of from about 0.20 to about 0.75 Torr;
forming an insulating layer on said third region of hydrogenated amorphous silicon; and
depositing a metal layer on said insulating layer to form a Schottky barrier thereto.

11. The method according to claim 10 wherein the insulating layer is formed by heating the substrate incorporating the hydrogenated amorphous silicon in air at a temperature of from about 300° C. to about 350° C. for from about 10 minutes to about 30 minutes.

12. The method according to claim 10 wherein the solar cell is annealed at from about 150° C. to about 250° C. for from about several minutes to one hour.

* * * * *